United States Patent
Sanduleanu

(10) Patent No.: US 6,815,988 B2
(45) Date of Patent: Nov. 9, 2004

(54) DIFFERENTIAL CHARGE PUMP

(75) Inventor: Mihai Adrian Tiberiu Sanduleanu, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/217,824

(22) Filed: Aug. 12, 2002

(65) Prior Publication Data

US 2003/0034813 A1 Feb. 20, 2003

(30) Foreign Application Priority Data

Aug. 16, 2001 (EP) .............................................. 01203120

(51) Int. Cl.[7] .................................................. H03L 7/06
(52) U.S. Cl. .................................... 327/157; 327/155
(58) Field of Search ................................. 327/155, 157

(56) References Cited

U.S. PATENT DOCUMENTS 5,483,194 A    1/1996  Genest ........................ 330/253
5,619,161 A  * 4/1997  Novof et al. ................ 327/535
5,736,880 A  * 4/1998  Bruccoleri et al. ......... 327/157
5,781,036 A    7/1998  Williams et al. ............ 327/157
6,292,061 B1 * 9/2001  Qu .............................. 331/17
6,466,070 B1 *10/2002  Ross .......................... 327/157

FOREIGN PATENT DOCUMENTS

WO     WO0060740       10/2000

* cited by examiner

Primary Examiner—Kenneth B. Wells
(74) Attorney, Agent, or Firm—Aaron Waxler

(57) ABSTRACT

A differential charge pump, including a phase-locked loop, a first input, an inverse second input, a first current source for generating a first current in accordance with the signal inputted into the first input, a second current source for generating an inverse second current in accordance with the signal inputted into the second input; and a first output and a second output for outputting the first and second currents, respectively. The common mode output currents are essentially equal to the currents generated by said first and second current sources, respectively.

20 Claims, 4 Drawing Sheets

DIFFERENTIAL CHARGE PUMP

Figure 1:
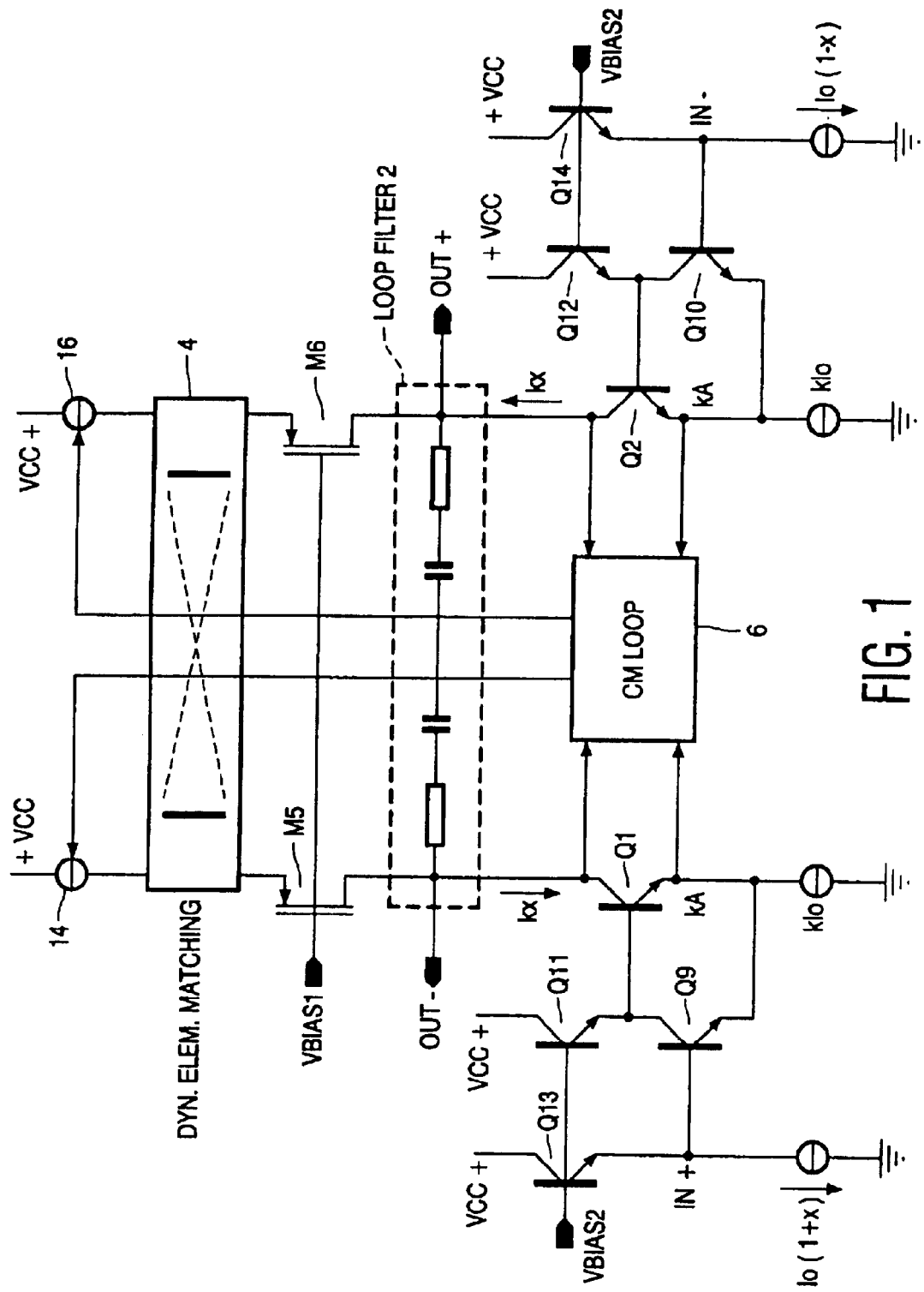

The present invention relates to a differential charge pump, in particular for use in a tuning system including a phase-locked loop, for generating currents, comprising a first input and an inverse second input, in particular for receiving differential signals from a phase comparator, first current source means for generating a first current in accordance with the signal inputted into said first input, second current source means for generating an inverse second current in accordance with the signal inputted into said second input, and a first output and a second output for outputting said first and second currents, respectively.

A differential charge pump is used e.g. in tuning systems including a phase-locked loop (PLL) with large tuning range ("Sonet"/"SDH" applications) wherein a preferable application is the Data and Clock Recovery (DCR) function. However, such a differential charge pump can be used in any type of tuning system mostly in relationship with a linear phase detector so that the above mentioned implementation does not impair the generality of the application of such a differential charge pump.

In a PLL environment, a phase detector (PD) drives differentially the input of the differential charge pump. It can be of linear type or bang-bang type since the charge pump has to work in a linear mode. When using bang-bang phase detectors, the input pulses are rectangular signals and are linearly amplified by the differential charge pump.

EP 0 718 978 A1 discloses a differential charge pump comprising a lowpass filter network, two identical current generators for injecting the same current in a substantial continuous manner on two significant nodes of the lowpass filter and two pairs of identical, switchingly controlled current generators connected to said nodes, respectively, each capable of pulling a current. The two generators forming each of said two pairs are controlled by one of a pair of control signals and by the inverted signal of the other of said pair of control signals, respectively. All four switchingly controlled generators may be of the same type. The two current generators employed for continuously injecting the same current on the two nodes of the lowpass filter are controlled through a common feedback loop. The low pass filter network is chargeable and dischargeable by means of the switchingly controlled current generators.

From U.S. Pat. No. 6,111,470 A known is a PLL circuit with charge pump noise cancellation, wherein the switching time of the PLL circuit can be reduced by increasing circuit bandwidth. A charge pump is commonly used in the PLL circuit to drive a voltage control oscillator (VCO). The increase in bandwidth intensifies the noise which is contributed by the charge pump. To reduce such charge pump noise, a chopper stabilizer circuit modulates the noise to a sufficiently high frequency so that a low-pass filter filters out the modulated noise.

U.S. Pat. No. 5,485,125 discloses a phase-locked variable frequency oscillator arrangement including a voltage controlled oscillator (VCO) which is controlled by a control signal produced by charging or discharging of a capacitor in a charge pump circuit. The charge pump circuit includes current sources driven by up or down command signals from a phase detector which detects the phase of the VCO output. When the command signals are simultaneously active, a logic gate circuit supplies a reset pulse to the phase detector via a delay device which is adapted to the rise time of the current in the current sources. The delay device includes a transistor which forms a switched pair with one of the transistors forming the current sources. The reset signal is produced when the current of such transistor reaches a selected fraction of its normal current, after being turned on by the logic gate circuit.

Further PLL circuits including a charge pump in a similar manner as described above are disclosed in U.S. Pat. Nos. 5,534,823 A, 5,943,382 A and 5,113,152 A.

As already mentioned above, a differential charge pump can be preferably used in highspeed tuning systems where speed plays an important role, since the differential implementation allows large swings.

However, a problem is the occurrence of common mode noise and noise coming from the substrate and the power supply.

An objection of the present invention is to provide a differential charge pump which is robust towards common mode noise and noise coming from the substrate and power supply.

In order to achieve the above and other objects, according to the present invention, there is provided a differential charge pump, in particular for use in a tuning system including a phase-locked loop, for generating currents, comprising a first input and an inverse second input, in particular for receiving differential signals from a phase comparator, first current source means for generating a first current in accordance with the signal inputted into said first input, second current source means for generating an inverse second current in accordance with the signal inputted into said second input; and a first output and a second output for outputting said first and second currents, respectively, characterized by a first controllable common mode current source means for additionally feeding common mode current to said second output, a second controllable common mode current source means for additionally feeding common mode current to said second output; and common mode controlling means for controlling said first and second common mode current source means so as to make the common mode currents essentially equal to the currents generated by said first and second current source means, respectively.

The differential charge pump having a construction in accordance with the present invention is robust towards common mode noise and noise coming from the substrate and power supply, wherein the common mode circuit has low noise properties due to reduction of 1/f noise. In particular, the differential charge pump according to the present invention can be advantageously for burst data applications since offset compensation can be achieved. In case of an implementation in a PLL arrangement, the invention allows double swing at the output with the effect of reducing the gain constant of the VCO which again helps in reducing the residual phase noise of the PLL.

Further advantageous embodiments of the present invention are defined in the dependent claims.

In a preferred embodiment of the present invention, the common mode controlling means controls said first and second controllable common mode current source means under the condition that the common mode voltage at said first and second outputs is made essentially half of said supply voltage. This embodiment comprises a preferred construction for allowing double swing at the output.

For the above preferred embodiment it is advantageous to provide first common mode voltage detecting means for detecting the output common mode voltage at said first and second outputs, wherein the signals outputted from said first common mode voltage detecting means and representing the common mode voltages at the outputs are inputted into said common mode controlling means.

In accordance with a further preferred embodiment of the present invention, the common mode controlling means controls said first and second controllable common mode current source means under the condition that the common mode voltage at said first and second outputs is made essentially equal to the common mode voltage at said first and second inputs. Such condition is very advantageous to realize a situation in order to make the common mode current generated by said first and second controllable common mode current source means equal to the currents generated by said first and second current source means, respectively.

For the above recently mentioned embodiment it is advantageous to provide, in additional to the above mentioned first common mode voltage detecting means, second common mode voltage detecting means for detecting the input common mode voltage at said first and second inputs, wherein the signals outputted from said second common mode voltage detecting means and representing the common mode voltages at the inputs are inputted into said common mode controlling means, too.

The above recently mentioned embodiment can further comprise a differential current amplifier means including at least a first transistor with its base connected to a path leading to said first input and its emitter-collector path defining a path leading to said first output, and a second transistor with its base connected to a path leading to said second input and its emitter-collector path defining a path leading to said second output, wherein the common mode controlling means controls said first and second controllable common mode current source means so as to make the common mode currents essentially equal to the currents flowing through the emitter-collector paths of said first and second transistors, respectively. Further or alternatively, the common mode voltage at the emitter or collector of said first and second transistors is essentially equal to the common mode voltage at the base of said first and second transistors.

A still further preferred embodiment is characterized by a dynamic element matching means coupling said first and second controllable common mode current source means with said first and second outputs, respectively, for making the common mode currents generated by said first and second common mode current sources essentially equal to each other, said dynamic element matching means comprising a first input connected to said first controllable common mode current source means, a second input connected to said second controllable common mode current source means, a first output connected to a path leading to said first output and a second output connected to a path leading to said second output. The provision of such a dynamic element matching means helps in a very convenient way to minimize the 1/f noise and offset. A further advantage of this embodiment is that the dynamic element matching means is not provided in the signal path such that it does not affect the signal.

Moreover, an output filter means can be provided where the currents are integrated, respectively.

When combining both the above recently mentioned embodiments, provided can be a first cascode transistor with its base applied to a bias voltage and its emitter-collector path coupling the first output of said dynamic element matching means to said first output, and a second cascode transistor with its base applied to a bias voltage and its emitter-collector path coupling the second output of said dynamic element matching means to said second output, said first and second cascode transistors isolating said output filter means from said dynamic element matching means. The use of such cascode transistors facilitates local (in particular low-pass) filtering of spurious signals with extra attenuation due to the output filter means.

Usually, the bias voltage applied to the base of said first cascode transistor is equal to the bias voltage applied to the base of said second cascode transistor. Preferably, said first and second cascode transistors, are MOS transistors in particular PMOS transistors.

In order to provide high impedance and less loading effects with parasitics, output buffer means can be provided preferably coupled between the output filter means and the outputs.

Figure 2:
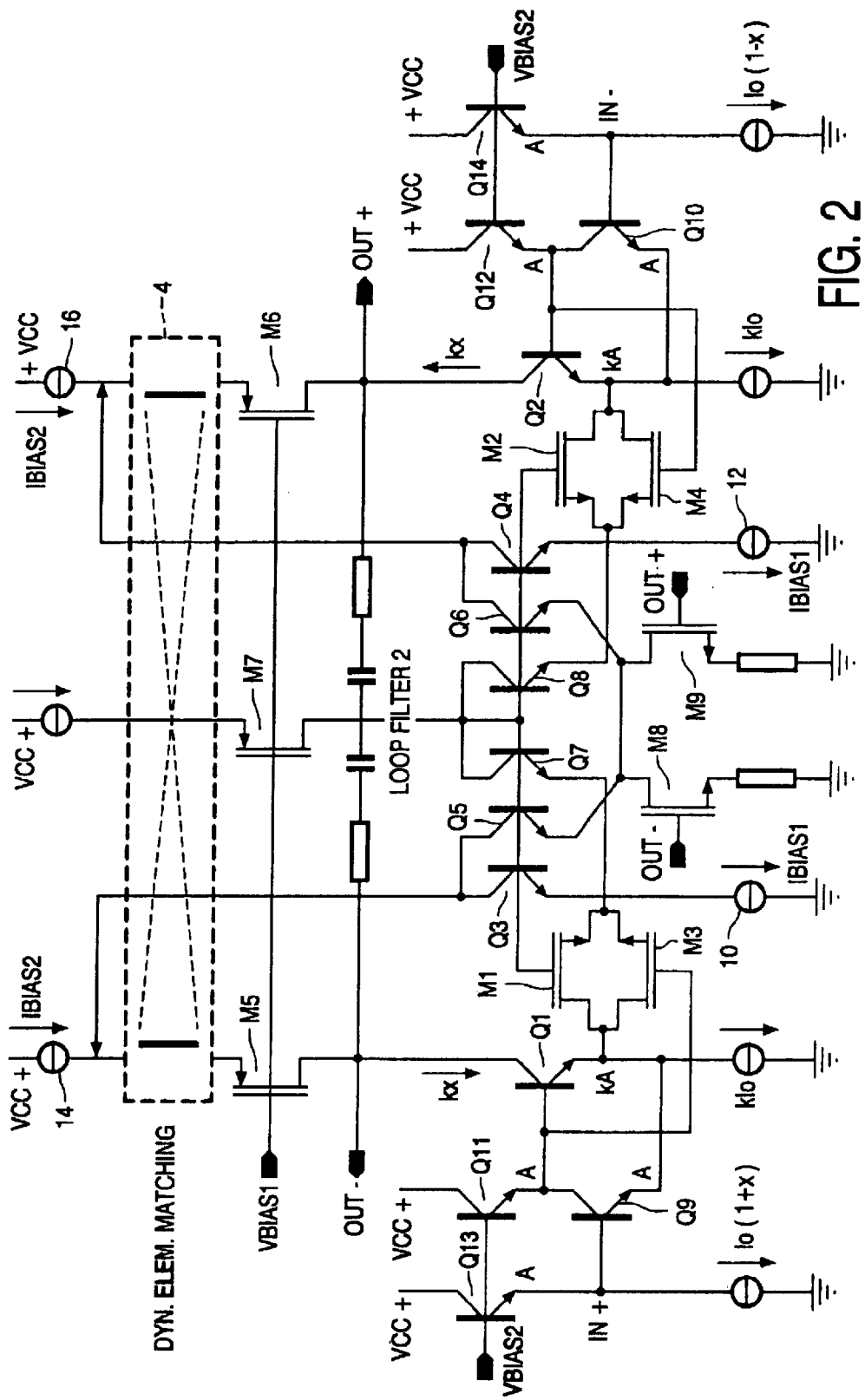
Figure 3:
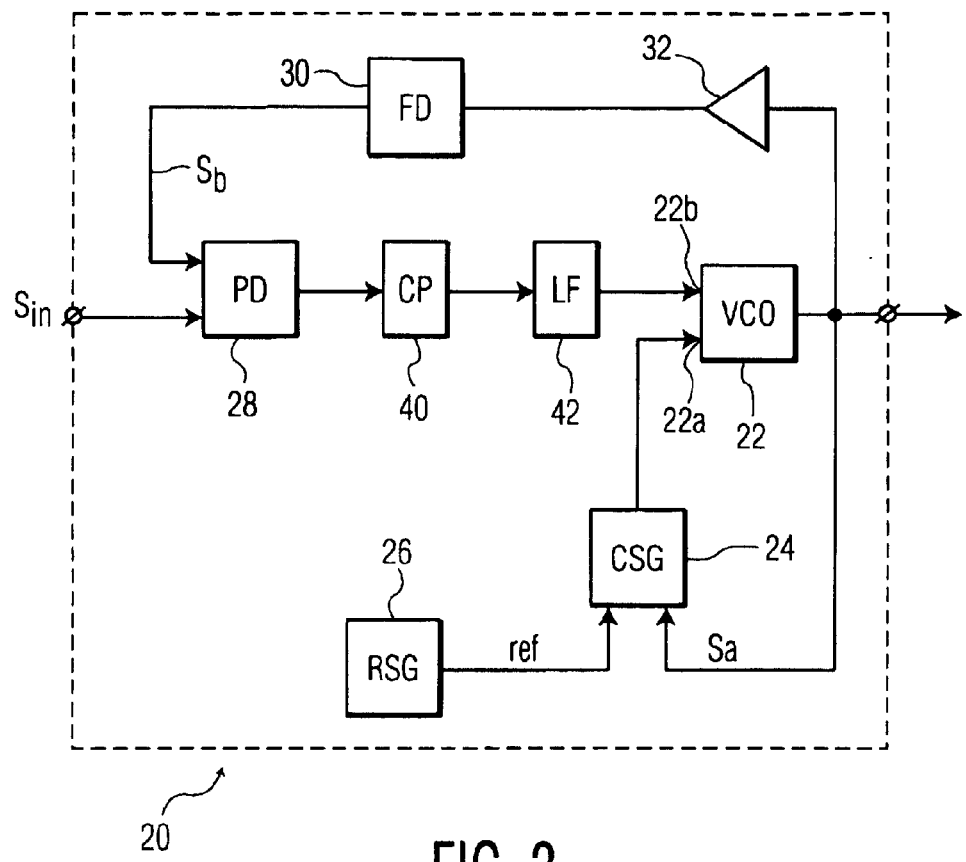
Figure 4:
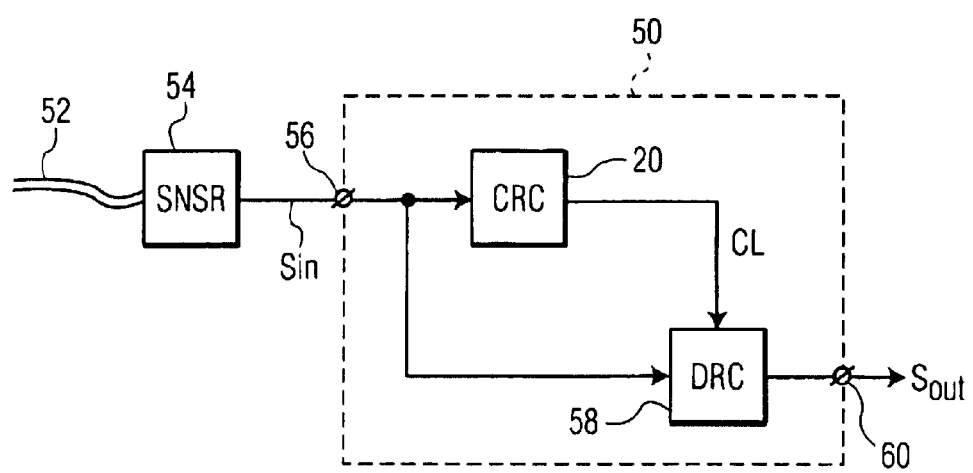
Figure 5:
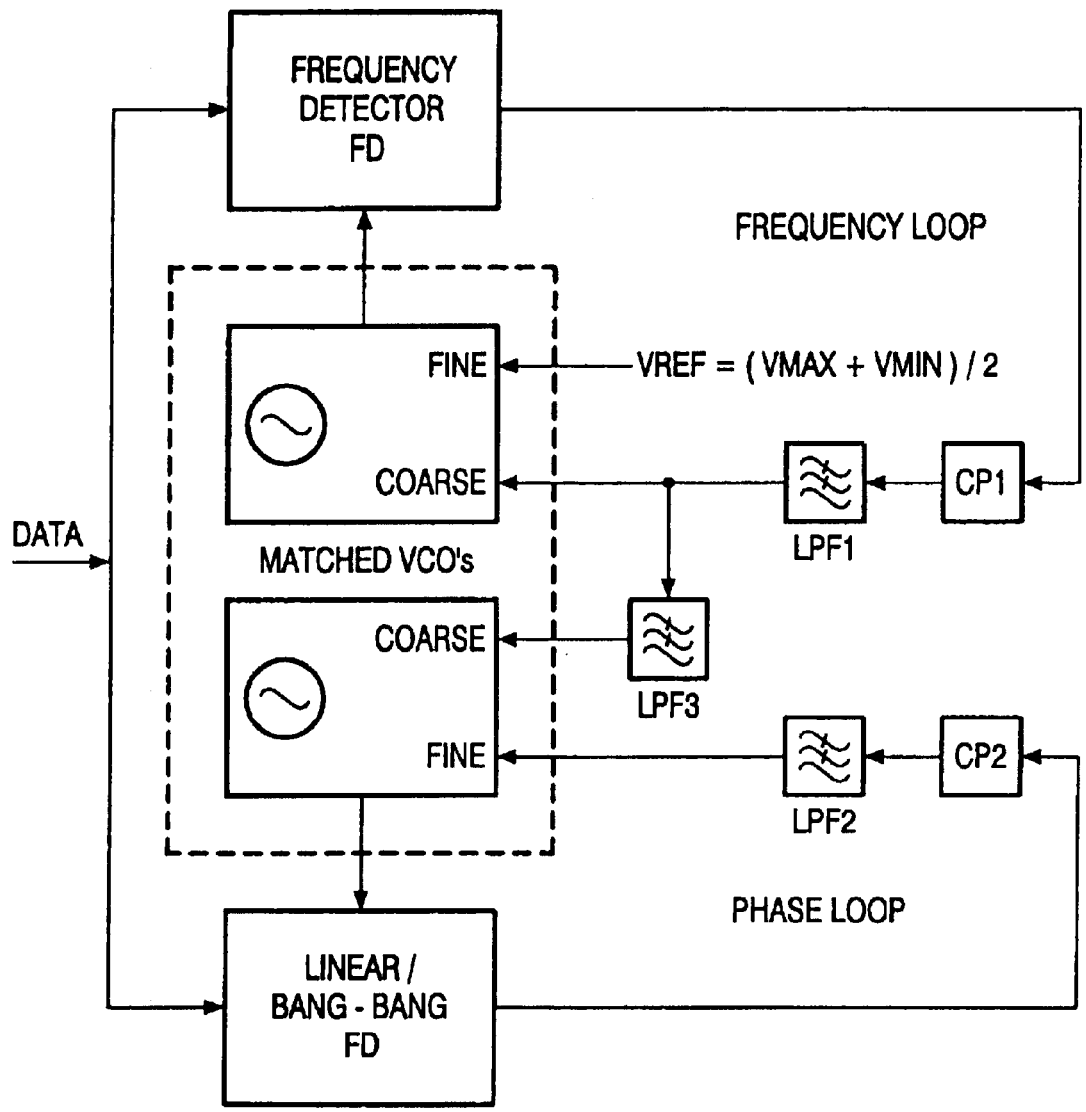

The above and other objects and features of the present invention will become clear from the following description taken in conjunction with the preferred embodiment with reference to the accompanying drawings in which:

FIG. 1 is a principle circuit diagram of a differential charge pump in accordance with a preferred embodiment of the present invention;

FIG. 2 a circuit diagram of the differential charge pump of FIG. 1 showing the common mode loop in more detail;

FIG. 3 a preferred embodiment of a clock recovery circuit including the charge pump;

FIG. 4 a preferred embodiment of a receiver for a fiber-optic channel including the clock recovery circuit of FIG. 3; and FIG. 5 a further preferred embodiment of a data and clock recovery unit including charge pumps.

In FIG. 1 shown is a principle circuit diagram of a preferred embodiment of a differential charge pump. The transistors Q13, Q11, Q9 and Q1 define a first current amplifier and level shifter, whereas the transistors Q14, Q12, Q10 and Q2 define a second current amplifier and level shifter. The bases of the transistors Q13 and Q14 are biased at a constant voltage VBIAS2 which is about half of the supply voltage VCC. A first node which connects the emitter of the transistor Q13 to a first current source Io(1+x) defines a first input IN+; and a second node which connects the emitter of the transistor Q14 to a second current source Io(1−x) defines an inverse second input IN−.

Q13, Q11, Q9, Q1 and Q14, Q12, Q10, Q2, respectively, are connected in a translinear loop. Given the fact that Q13 and Q14 are biased at the same base voltage which is the mentioned bias voltage VBIAS2, the base-emitter voltages of Q13, Q11, Q9, Q1 and of Q14, Q12, Q10, Q2, respectively, have the following relationship:

$$V_{BE13}+V_{BE9}=V_{BE11}+V_{BE1} \quad (1).$$

$$V_{BE14}+V_{BE10}=V_{BE12}+V_{BE2} \quad (2).$$

Further, the currents through the collectors of Q13, Q11, Q9, Q1 and of Q14, Q12, Q10, Q2, respectively, have the following relationship:

$$I_{C13} \times I_{C9} = I_{C11} 33\ I_{C1} \quad (3).$$

$$I_{C14} \times I_{C10} = I_{C12} \times I_{C2} \quad (4).$$

Since the currents of Q11 and Q9 are equal, the current of Q1 is a replica of the input current which can be scaled with the emitter sice; and since the currents of Q12 and Q10 are equal, the current of Q2 is a replica of the inverse second input current which can be scaled with the emitter size. So, the input differential current Io(1+x) and Io(1−x) is copied and scaled in the collector of Q1 and Q2 with the factor k determined by Q1 and Q2, respectively.

The PMOS transistors M5, M6 act as cascode transistors for enhancing the gain of the circuit isolating an output loop filter 2 from a dynamic element matching circuit 4. The output loop filter 2 is provided for the local filtering of spurious signals generated by switching effects in the dynamic element matching circuit 4.

Further provided is a common mode circuit 6 for keeping the common mode voltage at the differential output consisting of a first output OUT+ and an inverse second output OUT− at about half of the supply voltage VCC. The common mode circuit 6 measures the common mode voltage at the differential output and adjusts the netto current flow in the PMOS transistors M5, M6 until the DC current of the PMOS transistors M5, M6 equals the collector currents kIo of Q1 and Q2.

The output loop filter 2 is differentially applied at the first output OUT+ and the inverse second output OUT− and is preferably provided as lowpass filter filtering the differential output signal before applying it e.g. to a tuning port of a VCO.

FIG. 2 is a circuit diagram of the differential charge pump showing the implementation of the common mode circuit of FIG. 1 in more detail. The common mode voltage in the emitters of Q11 and Q12 which voltage is about VBIAS2−$V_{BE11}$ and VBIAS2−$V_{BE12}$, respectively, is sensed by MOS transistors M3 and M4, respectively. The resistance of the MOS transistors M1, M3, M2 and M4 will be adjusted until the common mode voltage in the base of the transistors Q3, Q5, Q7, Q8, Q6 and Q4 (included in the common mode circuit 6 of FIG. 1) is constant and almost equal to the common mode voltage in the emitter of Q11 and Q12.

MOS transistors M9 and M8 sense the common mode voltage at the first output OUT+ and the inverse second output OUT− and provide equal currents to the transistors Q5 and Q6, respectively.

Further provided are bias current sources 10 and 12 coupled to the emitters of Q3 and Q4, respectively, for generating bias currents IBIAS1. Moreover, first and second common mode current sources 14 and 16 (cf. top of FIG. 2) are provided for generating and additionally feeding common mode bias currents IBIAS2 to the differential output OUT+/OUT−. The bias currents IBIAS1 and IBIAS2 are chosen such that in steady state the output common mode voltage is about half of the supply voltage VCC, i.e. VCC/2.

When the common mode voltage at the differential output OUT+/OUT− deviates from its desired value (VCC/2), the variation is amplified by the MOS transistors M8 and M9, and the difference is subtracted from the bias currents IBIAS2. The netto current flowing in the PMOS transistors M5 and M6 has a regulating effect on the common mode voltage correcting its deviation.

By choosing the voltage VBIAS2 such that the common mode voltage in the emitter of Q11 and Q12 is half of the supply voltage VCC, i.g. VCC/2, the output transistors Q1 and Q2 have a collector-base voltage of zero whereby the Early effect is minimized due to their finite output resistance.

The dynamic element matching circuit 4 has the role of reducing the 1/f noise of the netto current flowing through M5 and M6 and, at the same time, reducing the offset of it. When the transposition of signals in the dynamic element matching circuit 4 happens at a frequency far beyond the cut of frequency of the loop filter 2, the spurious signals from the dynamic element matching circuit 4 are filtered out by the loop filter 2.

In case any offset voltage at the differential output of the differential charge-pump acts as a static error in a PLL configuration, its effect is a drift in the VCO frequency. When burst type of signals are applied to the phase-detector of the PLL, the inactivity between two bursts translates into a frequency drift of the VCO. Therefore the PLL has to start again the frequency acquisition process which can cost extra time. The effect of the dynamic element matching circuit is clearly benefic in such situation. Less 1/f noise means also less residual phase-noise at the output of the PLL.

The differential implementation is robust towards common-mode noise and noise coming from substrate and power supply. It allows double swing at the output with the effect of reducing the gain constant of the VCO which again helps in reducing the residual phase-noise of the PLL.

The advent of fiber optic communications has brought fully integrated optical receivers in which low-power becomes a must in order to cope with higher integration densities and the limited thermal capabilities of existing packages. At the receiver side, data and clock recovery units (DCR), usually PLL based, are needed to recover the clock information and to retime the incoming data.

FIG. 3 shows a preferred embodiment of a clock recovery circuit 20 which comprises a voltage controllable oscillator 22. The controllable oscillator 22 is part of a frequency locked loop further including the control signal generator (CSG) 24. The controllable oscillator 22 has a coarse tuning port 22a which is coupled to the control signal generator 24. The control signal generator 24 receives a reference signal Sref from a reference signal generator (RSG) 26, such as a crystal. The controllable oscillator 22 also forms part of a phase locked loop which comprises a phase detector 28 for generating a phase difference signal Sd which is indicative for a phase difference between an input signal Sin and a feedback signal Sb. The feedback signal Sb is obtained by a frequency divider (FD) 30 from the output signal of the controllable oscillator 22. Further, the clock recovery circuit 20 of FIG. 3 includes a charge pump 40 which receives the output signal from the phase detector 28 at its input and is connected with its output to a low-pass-filter 42 whose output is coupled to a fine tuning port 22b of the controllable oscillator 22.

FIG. 4 shows a preferred embodiment of a receiver 50 for a fibre-optic channel 52. The receiver 50 comprises an input 56 for receiving an input signal Sin from a sensor (SNSR) 54 which is coupled to the fibre-optic channel 52. The receiver 50 of FIG. 4 further includes the clock recovery circuit (CRC) 20 of FIG. 3 which is coupled to the input 56 for receiving the input signal Sin as reference signal. A data recovery circuit (DRC) 58 is coupled to the clock recovery circuit 20 and to the input 56 and comprises an output 60 which generates a digital output signal Sout in response to the input signal Sin.

FIG. 5 shows a further preferred embodiment of a data and clock recovery unit comprising a frequency locked loop and a phase locked loop. The data and clock recovery unit of FIG. 5 comprises matched voltage-controllable oscillators wherein the one controllable oscillator is part of the frequency loop and the other controllable oscillator is part of the phase locked loop. Further, the data and clock recovery unit of FIG. 5 comprises two charge pumps wherein the one charge pump CP1 is included in the frequency locked loop and the other charge pump CP2 is included in the phase locked loop. Moreover, the data and clock recovery unit of FIG. 5 comprises low-pass filters wherein the one low-pass filter LPF1 is included in the frequency locked loop and the other low-pass filter LPF2 is included in the phase locked loop.

It should be noted here that the low-pass filter 42 of the clock recovery circuit of FIG. 3 and the low-pass filters LPF1 and LPF2 of the data and clock recovery unit of FIG. 5 are the low-pass filters as already shown in the implementation of the charge pump as described above in relation to FIGS. 1 and 2.

What is claimed is:

1. A differential charge pump for generating currents, comprising:
   a first input and an inverse second input;
   a first current source means for generating a first current in accordance with a signal inputted into said first input;
   a second current source means for generating an inverse second current in accordance with a signal inputted into said second input;
   a first output and a second output for outputting said first and second currents, respectively;
   a first controllable current source means for feeding a third current to said first output;
   a second controllable current source means for feeding a fourth current to said second output; and
   a controlling means for controlling said first and second controllable current source means so as to make the third and fourth currents essentially equal to the currents generated by said first and second current source means, respectively.

2. The differential charge pump of claim 1, further comprising supply voltage means for providing a supply voltage, wherein said controlling means controls said first and second controllable current source means under a condition that a common mode voltage at said first and second outputs is made essentially half of said supply voltage.

3. The differential charge pump of claim 2, further comprising first common mode voltage detecting means for detecting the output common mode voltage at said first and second outputs, wherein signals outputted from said first common mode voltage detecting means and representing the common mode voltages at the outputs are inputted into said controlling means.

4. The differential charge pump of claim 1, wherein said controlling means controls said first and second controllable current source means under a condition that a common mode voltage at said first and second outputs is made essentially equal to a common mode voltage at said first and second inputs.

5. The differential charge pump of claim 4, further comprising second common mode voltage detecting means for detecting the, input common mode voltage at said first and second inputs, wherein signals outputted from said second common mode voltage detecting means and representing the common mode voltages at the inputs are inputted into said controlling means.

6. The differential charge pump of claim 4, further comprising a differential current amplifier means including at least:
   a first transistor with its base connected to a path leading to said first input and its emitter-collector path defining a path leading to said first output, and
   a second transistor with its base connected to a path leading to said second input and its emitter-collector path defining a path leading to said second output,
   wherein said controlling means controls said first and second controllable current source means so as to make the third and fourth currents essentially equal to currents flowing through the emitter-collector paths of said first and second transistors, respectively.

7. The differential charge pump of claim 4, further comprising a differential current amplifier means including at least:
   a first transistor with its base connected to a path leading to said first input and its emitter-collector path defining a path leading to said first output, and
   a second transistor with its base connected to a path leading to said second input and its emitter-collector path defining a path leading to said second output,
   wherein the common mode voltage at the emitter or collector of said first and second transistors is essentially equal to the common mode voltage at the base of said first and second transistors.

8. The differential charge pump of claim 1, further comprising a dynamic element matching means coupling said first and second controllable current source means with said first and second outputs, respectively, for making the third and fourth currents generated by said first and second controllable current source means essentially equal to each other, said dynamic element matching means having a first input connected to said first controllable current source means, a second input connected to said second controllable current source means, a first output connected to a path leading to said first output and a second output connected to a path leading to said second output.

9. The differential charge pump of claim 1, further comprising output filter means where the currents are integrated, respectively.

10. The differential charge pump of claim 8, further comprising a first cascode transistor with its base applied to a bias voltage and its emitter-collector path coupling the first output of said dynamic matching means to said first output, and a second cascode transistor with its base applied to a bias voltage and its emitter-collector path coupling the second output of said dynamic matching means to said second output, said first and second cascode transistors isolating said output filter means from said dynamic matching means.

11. The differential charge pump of claim 10, wherein said bias voltage applied to the base of said first cascode transistor is equal to said bias voltage applied to the base of said second cascode transistor.

12. The differential charge pump of claim 10, wherein said first and second cascode transistors are PMOS transistors.

13. The differential charge pump of claim 1, further comprising output buffer means.

14. The differential charge pump of claim 9, further comprising output buffer means coupled between said output filter means and said outputs.

15. A clock recovery circuit comprising a differential charge pump in accordance with claim 1.

16. The clock recovery circuit of claim 15, further comprising a controllable oscillator means which both is part of a frequency locked loop and of a phase locked loop.

17. A receiver for a fibre-optic channel comprising:
   an input for receiving an input signal from a sensor which is coupled to the fibre-optic channel,
   a clock recovery circuit according to claim 15 coupled to the input for receiving said input signal as a reference signal,
   a data recovery circuit, coupled to said clock recovery circuit and the input, for generating a digital output signal in response to the input signal and an output signal of the clock recovery circuit, and
   an output for providing the digital output signal.

18. A differential charge pump, comprising:
   a first current source for generating a first current based on a signal at a first input and providing the first current to a first output;

a second current source for generating a second current based on a signal at a second input and providing the second current to a second output;

a first controllable current source for providing a third current to the first output;

a second controllable current source for providing a fourth current to the second output; and a controller for controlling the first and second controllable current sources so as to make the third and fourth currents approximately equal to the first and second currents, respectively.

19. The differential charge pump of claim 18, further comprising a voltage source for providing a supply voltage; and wherein the controller controls the first and second controllable current sources under a condition that a common mode voltage at the first and second outputs is made at least one of: approximately half of the supply voltage and approximately equal to a common mode voltage at the first and second inputs.

20. The differential charge pump of claim 19, further comprising:

a first voltage detector for detecting the output common mode voltage at the first and second outputs, wherein signals representing the common mode voltages at the outputs are provided from the first voltage detector to the controller; and a second voltage detector for detecting the input common mode voltage at the first and second inputs, wherein signals representing the common mode voltages at the inputs are provided from the second voltage detector to the controller.

* * * * *